United States Patent [19]
DiMucci et al.

[11] Patent Number: 5,887,302
[45] Date of Patent: Mar. 30, 1999

[54] CIRCUIT FOR PROVIDING JOG PULSE, JOG-OFF HIGH LIMIT, AND LOW BATTERY DETECT

[76] Inventors: Vito A. DiMucci, 14343 Old Wood Rd., Saratoga, Calif. 95070; Michael V. DiMucci, 5157 Hwy 33, Saginaw, Saginaw, Minn. 55779

[21] Appl. No.: 914,040

[22] Filed: Aug. 5, 1997

[51] Int. Cl.[6] .................................................. A61G 1/02
[52] U.S. Cl. ............................. 5/611; 318/443; 318/467; 318/468
[58] Field of Search .............................. 5/611; 318/443, 318/466, 467, 468, 264, 265, 266, 272, 286

[56] References Cited

U.S. PATENT DOCUMENTS

| | | | |
|---|---|---|---|
| 4,435,862 | 3/1984 | King et al. ..................................... | 5/66 |
| 5,022,105 | 6/1991 | Catoe ............................................ | 5/11 |
| 5,271,113 | 12/1993 | White .......................................... | 5/611 |
| 5,279,011 | 1/1994 | Schnelle ...................................... | 5/616 |
| 5,495,914 | 3/1996 | DiMucci et al. ......................... | 5/611 X |
| 5,697,471 | 12/1997 | DiMucci et al. ......................... | 5/611 X |
| 5,740,884 | 4/1998 | DiMucci et al. ......................... | 5/611 X |

*Primary Examiner*—Bentsu Ro
*Attorney, Agent, or Firm*—Skjerven, Morrill, MacPherson, Franklin, & Friel LLP; Alan H. MacPherson

[57] ABSTRACT

A compact, lightweight, power lifting unit assists the operator of a mobile patient transporter in raising or lowering the patient bed to the desired height required in transporting or transferring a patient. The power lifting unit may also be used to "collapse" the transporter to its lowest height. The power lifting unit is adaptable and may be installed on virtually any existing "X" frame transporter. Electronic controls allow a single operator to raise or lower the patient bed or allow the patient bed to coast gently to a rest position. In particular, in one embodiment the power lifting unit includes a jog pulse circuit that prevents operators from jamming the transporter. In another embodiment, the power lifting unit includes a jog-off high limit circuit that prevents operators from attempting to raise the transporter beyond its maximum height. In yet another embodiment, a power lifting unit includes a low battery detection circuit that provides both an audible and a physical indication (i.e., a pulsating response) to operators of a low battery condition (i.e., when battery voltage decreases below a predetermined level).

20 Claims, 6 Drawing Sheets

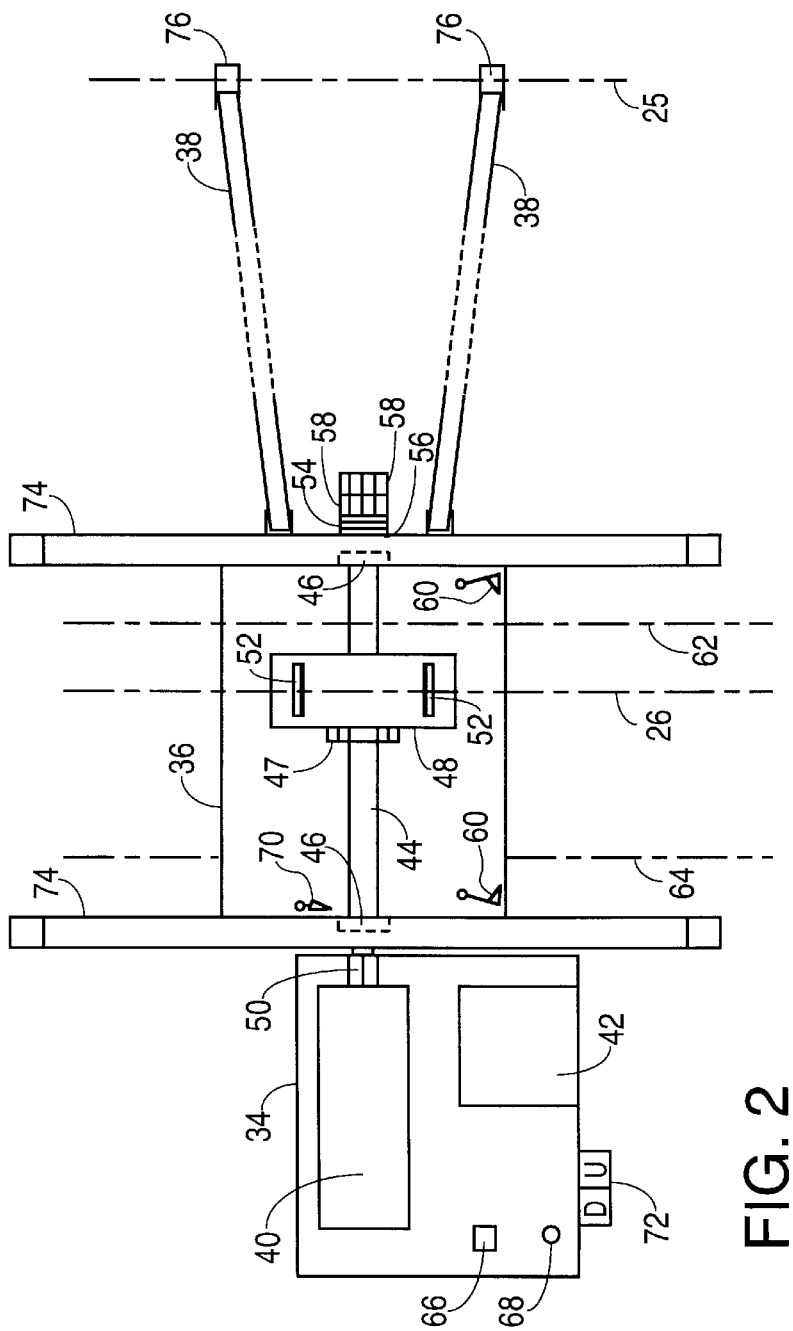
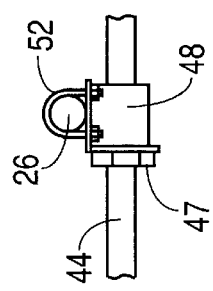
FIG. 2
FIG. 3

CIRCUIT FOR PROVIDING JOG PULSE, JOG-OFF HIGH LIMIT, AND LOW BATTERY DETECT

FIELD OF THE INVENTION

This invention relates to a circuit of a power lifting unit for adjusting the height of a "gurney" or mobile patient transporter used, for example, to transport patients to or from a health care facility.

BACKGROUND OF THE INVENTION

It is frequently necessary to transport patients to or from a hospital or from one area within a health care facility to another part of the health care facility. In transporting patients, operators (usually two Emergency Medical Technicians) are routinely required to physically lift the transporter carrying the patient. This places the operators at a high risk of significant and even crippling back injuries, particularly in the field where regular hospital facilities are not available.

The transporters used to move patients from one location to another within a health care facility are frequently expensive, heavy duty devices which are unsatisfactory for use in the field. These intra-hospital transporters usually must be connected to an electrical outlet in order to adjust the position or height of the transporter for the patient's comfort or for transferring the patient to or from an operating table or other medical apparatus.

Various attempts have been made to reduce the back stress and the risk of back injury to transporter operators. For example, U.S. Pat. No. 5,495,914 (DiMucci et al.) issued Mar. 5, 1996, discloses a lightweight, compact, cost effective, and adaptable power-assisted mobile patient transporter. Copending application, Ser. No. 08/511,848, filed Aug. 7, 1995 as a continuation-in-part of U.S. Pat. No. 5,495,914 (DiMucci et al.), entitled "POWER LIFTING UNIT AND METHOD FOR CONVERTING MOBILE PATIENT TRANSPORTER" by Vito A. DiMucci and Michael V. DiMucci, also discloses a power-assisted mobile patient transporter.

However, present power-assisted lifting mechanisms for transporters typically suffer from a number of disadvantages. For example, the present power-assisted lifting mechanisms for gurneys assume that operators will activate the present power-assisted lifting mechanisms by fully pulling the handle for engaging the motor of the power-assisted lifting mechanism. Unfortunately, operators become accustomed to the minimal effort required to use the present power-assisted lifting mechanisms, and operators may not fully pull the handle before attempting to raise or lower the gurney. As a result, the present power-assisted lifting mechanisms may jam, because operators do not fully pull the handle for the minimal period of time necessary to sufficiently jog the motor to release the detent mechanism of the gurney.

Another problem with the present power-assisted lifting mechanisms is that operators may attempt to raise the gurney beyond the maximum height of the gurney. In particular, the present power-assisted lifting mechanisms permit operators to pull the handle and jog the motor even if the gurney has been raised to its maximum height. As a result, operators may attempt to drive the power-assisted lifting mechanism to raise the gurney beyond its maximum height thereby causing excessive stress on components of the lifting mechanism and gurney.

A further problem with present power-assisted lifting mechanisms is that present power-assisted lifting mechanisms fail to provide operators with adequate warning of a low battery condition.

SUMMARY OF THE INVENTION

In accordance with the present invention, an improved compact, lightweight, inexpensive power lifting unit assists the operator of a mobile patient transporter in raising or lowering the patient bed to the desired height required in transporting or transferring a patient. The power lifting unit may also be used to "collapse" the transporter. For example, in loading the transporter into an ambulance, the upper bed frame is supported at the head end by the ambulance floor and at the foot end by the operator. The lifting unit then raises the lower frame to "collapse" the transporter and allow the transporter to be easily rolled into the ambulance using small wheels or one or more rollers on the bottom of the head end of the upper bed frame by a single operator without undue strain.

The power lifting unit is adaptable and easily installed on numerous existing transporters of the type using the "X" frame concept or an equivalent structure to raise or lower the bed frame. Interlocks and safety features may be provided which require the operator to be in the desired operating position to safely control the transporter before any lifting or loading action can be initiated. The lifting unit is compact and weighs less than 20 pounds, but is capable of reducing the lifting effort required by the operator to less than 20 percent of the effort normally required.

In particular, in one embodiment of the present invention a power lifting unit includes a jog pulse circuit. The jog pulse circuit requires that an operator fully pull the handle of the power lifting unit in order to raise or lower the transporter. Accordingly, the jog pulse circuit prevents the operator from jamming the transporter.

In another embodiment, a power lifting unit includes a jog-off high limit circuit. In particular, the jog-off high limit circuit prevents operators from attempting to raise the transporter when the transporter has already been raised to its maximum height.

In yet another embodiment, a power lifting unit includes a battery detection circuit. In particular, the battery detection circuit provides both an audio alarm and a physical indication (i.e., a pulsating response) to notify operators of a low battery condition (i.e., when battery voltage decreases below a predetermined level).

This invention will be more fully understood in accordance with the following written description taken together with the drawings.

DESCRIPTION OF THE DRAWINGS

FIG. 2 is a top view illustrating one embodiment of a power lifting unit according to the present invention.

FIG. 3 is a side view showing the nut and flange assembly of the power lifting unit.

FIG. 4b illustrates the top view of the unitary structure shown in FIG. 4a.

DETAILED DESCRIPTION

Figure 1A:
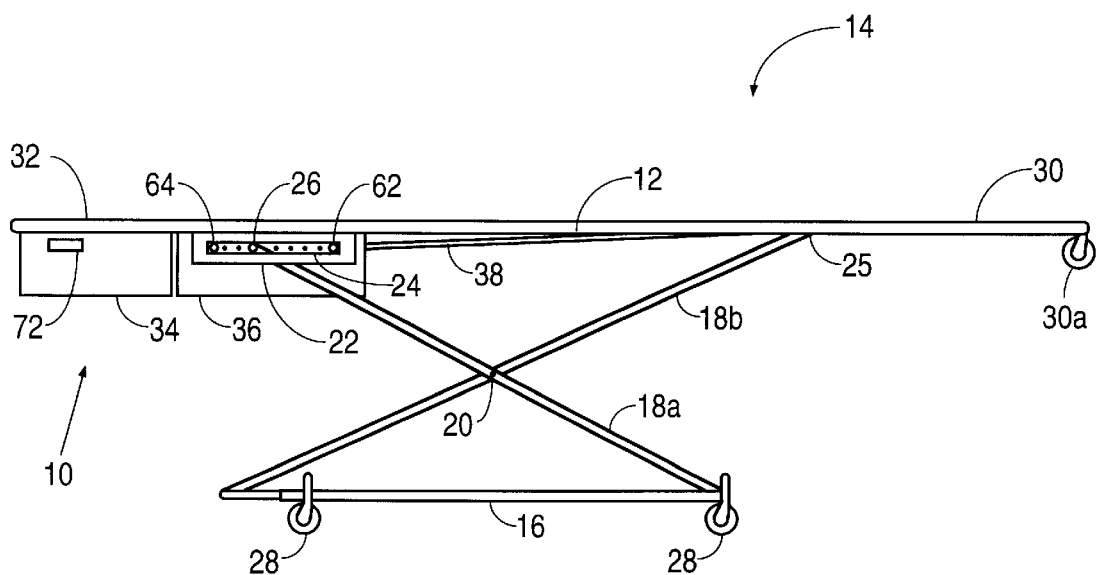
FIG. 1a is a side view illustrating one embodiment of a power lifting unit according to the present invention, installed on a mobile patient transporter.
Figure 1B:
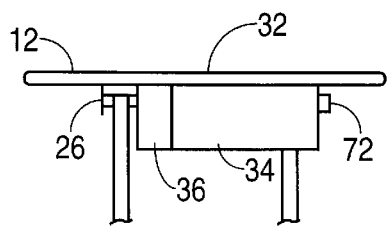
FIG. 1b is a foot-end view showing the power lifting unit installed on a mobile patient transporter.

FIG. 1a is a side view illustrating one embodiment of a power lifting unit 10 according to the present invention, installed on the underside of the upper frame member 12 of a mobile patient transporter 14. It should be understood that mobile patient transporters are sufficiently well known in the art that the features of the transporter 14 are not shown in detail in the drawings. Although the different kinds of existing transporters may vary slightly in their construction, virtually any existing transporter using an "X" type frame or equivalent for lifting the patient may be easily adapted for the installation of the power lifting unit 10 of the present invention, as will be described below. In order to describe the operation of the power lifting unit 10, it is sufficient to describe the transporter 14 as having (a) a lower frame member 16, (b) a pair of side frame members 18a which are pivotally connected to a second pair of side frame members 18b at the pivot point 20, (c) an upper frame member 12, (d) two brackets 22 each with a slot 24 therein, one each attached to opposite sides of the upper frame 12 near one end of the upper frame, (e) a support arm (not shown in FIGS. 1a and 1b, but having a longitudinal axis 25 shown in FIGS. 1a and 2) connecting the upper ends of the pair of side frame members 18b, and (f) a sliding arm 26 connecting the upper ends of the pair of side frame members 18a and having two protruding ends which slide back and forth within the two slots 24 (only one slot 24 is shown in FIG. 1a). Thus, two slotted brackets 22 are used, one on each of the two sides of the upper frame 12. The upper ends of the pair of side frame members 18b are pivotally connected to the upper frame 12. The lower ends of both pairs of side frame members 18a, 18b are pivotally connected to the lower frame 16. One pair or both pairs of side frame members 18a, 18b may be telescoping members. Alternatively, the lower ends of the pair of side frame members 18b (i.e, the sections of side frame members 18b beneath pivot point 20) may be slidably as well as pivotally connected to the lower frame 16 in order to allow the side frame members 18a, 18b to pivot about the pivot point 20 when the upper frame 12 is raised or lowered. A "detent" or locking mechanism (shown in top view in FIGS. 7a and 7b) mounted on the upper frame 12 is used to hold the upper frame 12 of transporter 14 in a stationary position after the upper frame 12 has been raised or lowered to the desired height. Wheels 28 mounted on the lower frame member 16 enable the operator to easily move the transporter 14 along the ground or floor. The transporter 14 is used to carry a patient (not shown) on a bed frame mounted on the upper frame 12, with the patient's head at the head end 30 and the patient's feet at the foot end 32.

In FIG. 1a, the power lifting unit 10 includes a drive unit 34, a drive train 36, and a pair of tension arms 38, which are shown in FIG. 2 in more detail. As shown in FIG. 2, the drive unit 34 includes an electric motor 40 (e.g., a 12-volt d.c. gear motor). Because of its small size, the electric motor 40 may be powered by a portable rechargeable battery 42. The rechargeable battery 42 is connected to the electric motor 40 using a quick disconnect connector of well-known design, so that the battery 42 may be easily removed, recharged, and reinstalled. A spare rechargeable battery 42 can be kept in a recharger in the van or other vehicle carrying the transporter. Mobile transporter vans are typically equipped with 110-volt a.c. outlets which can be used for recharging the battery 42.

The drive train 36 (FIGS. 1a and 2) includes a lead screw 44 (FIGS. 2 and 3) supported at both ends by radial bearings 46. The lead screw 44 is engaged by a nut 47 (FIGS. 2 and 3) which is part of a nut and flange assembly 48 (shown in side view in FIG. 3). One end of the lead screw 44 is coupled by a shaft coupling 50 to the drive shaft of the electric motor 40. Rotation of the lead screw 44 by the electric motor 40 drives the nut and flange assembly 48 axially (to the left or the right in FIG. 2) along the lead screw 44. The nut and flange assembly 48 is attached to the sliding arm 26 (FIGS. 1a, 1b, 2 and 3) of the transporter 14 by means of fasteners 52 (FIGS. 2 and 3) (e.g., U-clamps or saddles), so that the sliding arm 26 is also driven to the left or the right with the nut and flange assembly 48. For example, driving the nut and flange assembly 48 to the right (toward the head end 30 (FIG. 1a) of the bed frame 12) forces the sliding arm 26 (FIGS. 1a, 1b, 2 and 3) to the right (FIGS. 1a and 2). Because the sliding arm 26 is attached to the upper ends of pivotable side frame members 18a, the frame members 18a are pivoted clockwise about pivot point 20. The force driving the sliding arm 26 to the right is opposed by a tensile force transmitted by the lead screw 44 (through the thrust bearing 54 and the head end plate 56 of the drive train housing 36 (FIG. 2)) to the tension arms 38 (FIGS. 1a and 2) which are pivotally connected to the head end plate 56 of the drive train housing 36. The thrust bearing 54 is secured to the lead screw 44 by jam nuts 58. Since the tension arms 38 are pivotally connected by "U"brackets 76 (FIG. 2) to the support arm (not shown, but having a longitudinal axis 25) which connects the upper end of pivotable side frame members 18b to the upper frame 12, the tensile force in frame members 38 tends to pivot the frame members 18b counterclockwise about pivot point 20. Thus, when sliding arm 26 (FIGS. 1a and 2) is driven to the right (toward end 30) by the lead screw 44 and the nut and flange assembly 48, both pairs of side frame members 18a and 18b are pivoted so that the upper frame 12 is raised to the desired height.

In one embodiment, the lead screw 44 is a ball screw which is extremely efficient in converting the rotary motion of the electric motor 40 to linear motion and producing a high linear thrust.

Limit switches 60 (shown schematically in FIG. 2) automatically turn off the drive unit 34 when the sliding arm 26 reaches a predetermined position corresponding to either the uppermost position 62 or the lowermost position 64 of the transporter 14. An audible alarm 66 can be used to indicate up/down movement, stall condition, and uppermost position 62 or lowermost position 64. A buzzer 68 can be used to provide a further indication of a low battery condition. Low battery detection is discussed in more detail with respect to FIG. 6.

In one embodiment, a manual locking handle 711 (FIG. 7b) and associated switch 70 (FIGS. 2 and 7b) operate in conjunction with an up/down switch 72 (FIGS. 1a, 1b, 2 and 7b) to ensure that the drive unit 34 operates only when the operator is correctly positioned at the foot end 32 of upper frame 12 to safely control the transporter 14. The well-known manual locking handle 711 engages and disengages a locking mechanism (shown schematically in FIGS. 7a and 7b) which allows the transporter 14 to be set at any of several different heights. Support arms 74 (FIG. 2) attach both to upper frame 12 and to the drive train housing 36 to attach housing 36 and motor unit 34 (which together make up power lifting unit 10) to the underside of upper frame 12.

Any existing transporter 14 (FIG. 1a) having a sliding arm 26 connecting frame members 18a and a support arm (not shown, but having a longitudinal axis 25) connecting frame members 18b can be easily adapted to work with this invention by installing the power lifting unit 10 of the present invention. Installation of the power lifting unit 10 simply requires (a) connecting the nut and flange assembly 48 (FIGS. 2 and 3) to the sliding arm 26 with fasteners 52 such as U-clamps, and (b) pivotally connecting the tension arms 38 to the support arm (not shown but having axis 25 in FIG. 2) with fasteners 76 such as U-clamps or yokes. The lengths of the tension arms 38 are adjustable (typically one end is threaded) in a well known manner to assure that the power lifting unit 10 may be installed on virtually any existing transporter 14.

An alternative embodiment (FIGS. 4a, 4b and 7b) uses a unitary structure 134 to hold the electric motor 40, the lead screw 144 and a threaded assembly 148 which holds the sliding arm 26, the ends of which are constrained to move in grooves 24 in supports 22 on the sidewalls of the gurney bed 30 (FIG. 1a). Tension arm 138 (FIG. 4b) is connected to one end of lead screw 144 and the distal end of tension arm 138 relative to motor 40 is connected through a u-clamp assembly having ends 176a and 176b rotatably attached to the fixed support arm 25 of the gurney. Thus, rotation of lead screw 144 in threaded assembly 148 moves sliding arm 26 either to the right in FIG. 4b (thereby moving sliding arm 26 closer to fixed support arm 25 and thereby raising the gurney) or moves sliding arm 26 away from fixed support arm 25 (thereby moving sliding arm 26 further from support arm 25 and thereby lowering the gurney). The unitary support structure 134 shown in FIGS. 4a, 4b and 7b has the advantage of allowing motor 40 and threaded assembly 148 to be pre-aligned with each other before assembly of the structure of this invention onto a pre-existing gurney.

Figure 5:
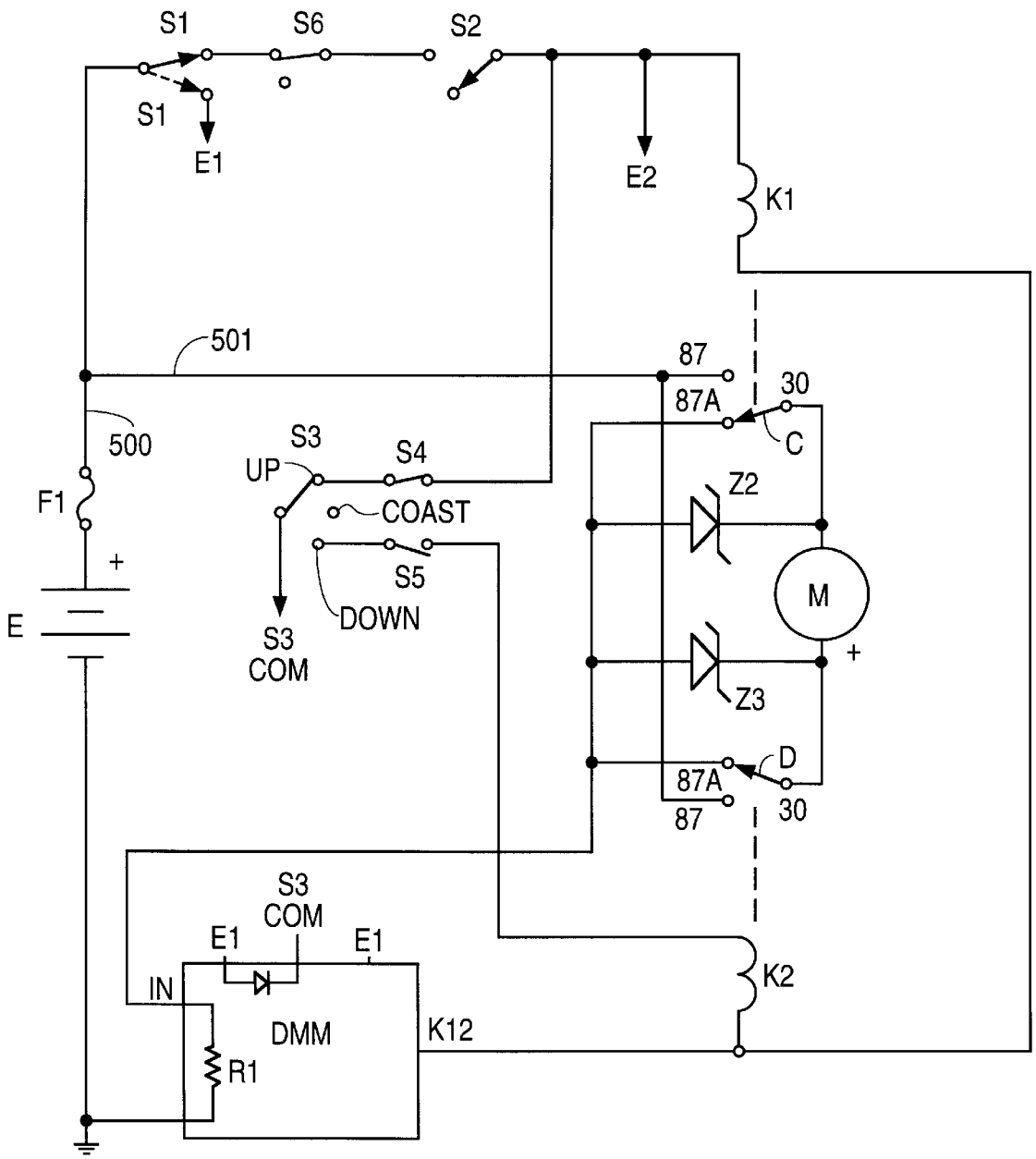
FIG. 5 illustrates an electrical circuit for controlling an electric motor used in raising and lowering the patient transporter in accordance with one embodiment of the present invention.

FIG. 5 illustrates an electrical circuit for controlling the operation of electric motor 40 in accordance with one embodiment of the present invention. Battery E supplies a desired direct current through fuse F1 which is sized to blow if the current exceeds a certain maximum value for a selected time. In one embodiment, fuse F1 is a 30 amp time-delay fuse which will create an open circuit should 30 amps flow through fuse F1 for greater than a selected time, typically about ten seconds. Other size fuses can be used as appropriate, depending on the motor, battery, and the desired operation of the system. The current from battery E passes through jog switch S2 (the function of which will be described below), switch S1 (the function of which will be described below), switch S6 (the function of which will be described below), through switch S7 (the function of which will be described below) and then through the coil of a relay K1 to activate the relay to bring the relay's arm C into contact with contact 87 attached by lead 501 to lead 500 from the positive terminal of battery E.

Figure 7A:
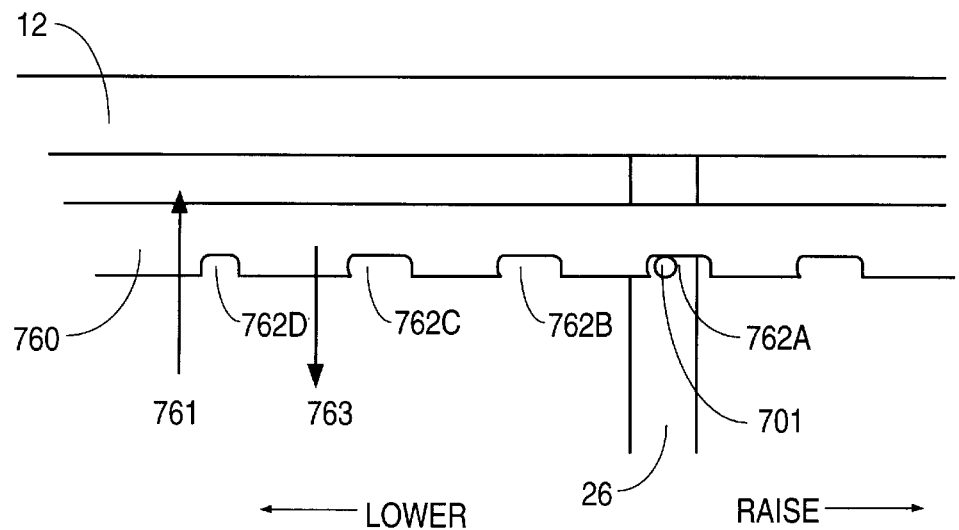
FIGS. 7a and 7b illustrate in top views a detent mechanism of a type commonly used on a mobile patent transporter.
Figure 7B:
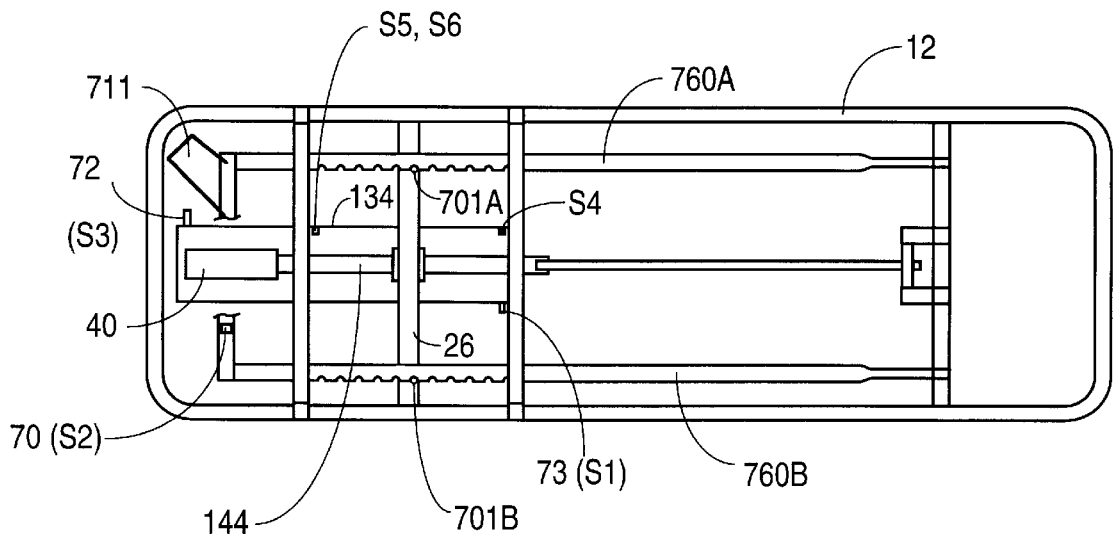

In one embodiment, once the motor has jogged detent pin 701 free from notch 762A in detent rod 760 (FIG. 7a), the detent switch 73 (S1 in FIG. 5) shown in FIG. 7b on the body 134 holding motor 40 and the remainder of the moveable assembly used to raise and lower the gurney, changes state and contacts the lead E1 shown in FIG. 5. In other words, S1 adopts the position shown by the dashed line labelled S1' in FIG. 5. Current from battery E then goes through conductor E1 now connected by switch S1 in position S1' to the input lead E1 on the DMM. This current provides power to activate the DMM and also continues on the lead labelled "S3A COM", COM stands for "common", to the switch S3A (labelled as switch 72 in FIGS. 2 and 7b). Switch S3A (72) is located at a convenient point on assembly 134 which is easily reachable by the operator.

As shown in FIG. 5, switch S3A (72) can have one of three positions, "up", "coast", or "down." If in the up position as shown, the motor will be driven to raise the gurney. If in the down position, that is if switch S3A conducts the current on S3A COM to the node labelled down, the motor will lower the gurney. However, if the switch S3A is in contact with the node labelled coast, no power will be provided to the motor and the gurney will coast to its natural resting position depending on the weight of the gurney. The inertia and friction of the motor and the threaded assembly and the lead screw together will result in a controlled easy drop of the upper frame 12 of the gurney to its rest position as long as the operator continues to pull handle 711 (FIG. 7b) thereby preventing the detent 760 (FIG. 7a) from snapping back to cause pin 701 (FIG. 7a) to lodge in one of notches 762A, 762B, 762C and 762D (FIG. 7a). When pin 701 lodges in one of notches 762A, 762B, 762C or 762D, the upper frame 12 and thus the patient is held at a height corresponding to this detent position. Should the operator let go of the handle 711, detent 760 will go in the direction shown by arrow 763 thereby locking the gurney at the height corresponding to the next detent position 762 reached by sliding arm 26 and pin 701 as the gurney coasts downward. Detent 760 is spring loaded to naturally return to a stop position whereby pin 701 is engaged in a notch such as notch 762A, for example. Typically, detent 760 has notches such as 762A every two or so inches along the detent 760 as shown by notches 762B, 762C and 762D in FIG. 7a.

Returning now to FIG. 5, if the switch S3A (72) is in the down position, current is passed through switch S5 to the coil of relay K2 which activates the proper contact of relay K2 to bring the arm "D" into contact with node 87 of relay K2. Because the lead into the motor connected to node 87 of relay K2 is of reverse polarity to the lead into the motor connected to node 87 of relay K1, the motor will go in the opposite direction thereby lowering the gurney. Placing the arms C and D of relay K1 and relay K2, respectively, on nodes 87A, will ground both inputs to the motor thereby preventing the gurney from accidentally being raised or lowered.

The lead which goes to ground from nodes 87a passes through the DMM and is used as a sensor to detect the number of rotations of the motor to allow the DMM to sense whether or not the motor has stalled. Should the motor stall, the DMM will then shut off current to the motor in a manner described below in conjunction with FIG. 6.

The appropriate one of zener diodes Z2 and Z3 breaks down if the voltage on either input lead to the motor exceeds a desired value. Zener diodes Z2 and Z3 basically surge protect the motor and the relay contacts. Switches S4 and S5 (FIG. 5) are respectively the high limit switch and the low limit switch which automatically shut off the motor M when the gurney reaches its high point or low point respectively. Switch S6 (FIGS. 5, 6 and 7b) is stacked on top of switch S5, the low limit switch, to prevent the motor from being jogged when the gurney is in its lowest position and the handle on the detent is pulled to allow the gurney to be raised. When the gurney is in its lowest position, no excessive force is required to release the detent bar 760 from the corresponding pin, and the notch 762D in detent bar 760 corresponding to this lowest position is too short to allow the motor M to effectively jog pin 701 without ramming pin 701 against the other end of the notch 762D. Accordingly, switch S6 is provided to open circuit the lead from S1 to S2 and thereby disable the jog feature when the gurney is in its lowest position.

Figure 6:
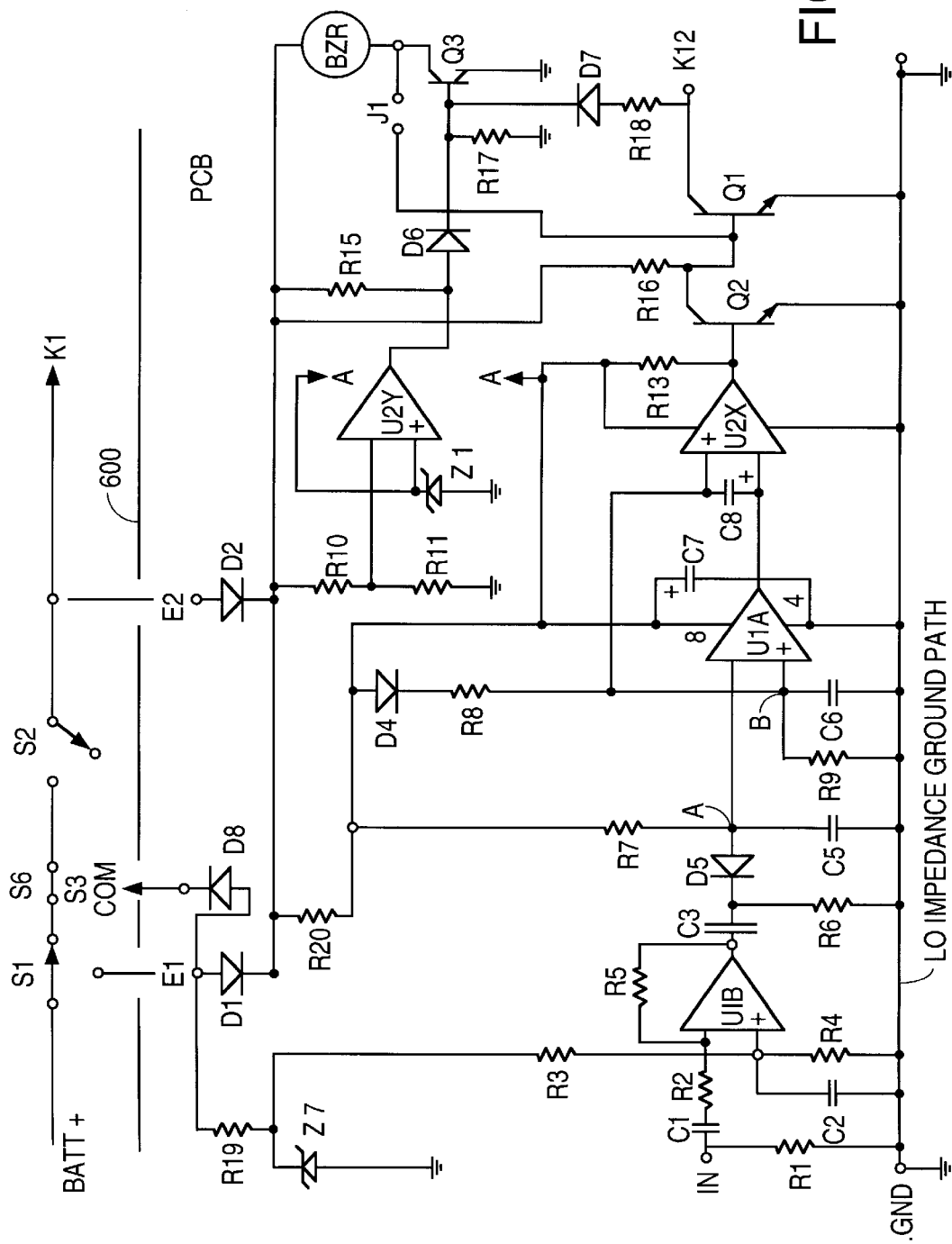
FIG. 6 illustrates the dynamic motor monitor ("DMM") portion of the circuit of FIG. 5.

In one embodiment, a jog-off high limit circuit is also provided. Specifically, the jog-off high limit circuit includes switch S7 (FIGS. 5, 6 and 7b). More specifically, switch S7 is stacked on top of switch S4, the high limit switch, to prevent the motor from being jogged when the gurney is in its highest position 762a on the detent bar 760 (FIG. 7a) and the handle 711 (FIG. 7b) is pulled to allow the gurney to be raised. Switch S7 is provided to open circuit the lead and thereby disable the jog feature when the gurney is in its highest position. Thus, the jog-off high limit circuit provides a safety feature that prevents sliding arm 26 from being driven past the uppermost position 762A of the detent bar 760 into the support 56 (FIG. 3) (also called the head-end bearing plate) of the gurney.

The schematic shown in FIG. 6 shows the conductor E1 coming onto the printed circuit board, the boundary of which is denoted by the line 600. Switches S1, S2, S6 and S7 above the line 600 function as described above in conjunction with FIG. 5. In FIG. 6, the conductor E1 transmits the current through diode D1 and also through diode D8 back out to S3A COM to function in a manner described above in conjunction with FIG. 5. However, the current through diode D1 serves to power up the circuitry on the PC board (shown in FIG. 6 below line 600) which then monitors the motor M (FIG. 5) to determine that the motor M is rotating. Should the motor rotation drop beneath a certain value, as detected by the circuit, then this circuit will shut off motor M (FIG. 5) in a manner to be described briefly. As shown in FIG. 5, the lead labelled K12 is the return current path for the current through relays K1 and K2. Should this path become open-circuit, no current will flow through relays K1 and K2. Therefore, these two relays will cause their corresponding switch arms C and D to go to the default position, namely contacting nodes 87a. When nodes 87a are contacted by the switch arms C and D associated with both relays K1 and K2 (which is the situation shown in FIG. 5), then no current will flow through motor M and the motor M will not be driven. The open circuiting of the lead K12 by the DMM essentially shuts off the motor M (FIG. 5).

In FIG. 6, the input lead labelled IN receives a signal which contains on it pulses reflecting the making and breaking of the brushes on the commutators in motor M as the rotor of motor M rotates. Typically, there are eight make-break cycles per rotation but this number can vary depending on the particular motor used and thus this number is not critical. However, as the motor M rotates, the pulses on the lead labelled IN are passed through blocking capacitor C1 and resistor R2 to the negative input lead of operational amplifier U1B. Operational amplifier U1B has its positive input lead connected to a reference voltage, namely the voltage on capacitor C2. The voltage on capacitor C2 is determined by the voltage across the zener reference Z7 divided by the R3–R4 voltage divider network. Typically, if resistors R3 and R4 are equal, the voltage at the positive input lead of operational amplifier U1B will be about 2.55 volts. R5 is a feedback resistor connecting the output lead of operational amplifier U1B to its negative input lead for control of gain in a well-known manner. Blocking capacitor C3 passes the AC component of the output signal from operational amplifier U1B and passes this AC component to node A in a peak detector comprising diode D5, capacitor C5 and resistor R7. This peak detector provides the input signal on node A to the negative input lead of operational amplifier U1A. The voltage on positive input lead of operational amplifier U1A is determined by the breakdown voltage of zener diode Zx. This breakdown voltage of zener diode Zx is conducted through diode D4 through resistors R8 and R9 to set up the bias voltage on node B connected to the positive input lead of U1A. Capacitor CS is approximately 100 microfarads and capacitor C6 is approximately ten microfarads. Resistors R6, R7, R8 and R9 are identical 47 kilo-ohms and therefore the time constants of the signals on the nodes A and B shown in FIG. 6 are determined by the values of capacitors CS and C6, respectively. Diode D4 matches in characteristics diode D5 to provide thermal compensation to the circuit. The normal state of node A is to have a higher voltage than node B. This higher voltage is designed to be 1 diode forward voltage drop such that node A is approximately 0.6 volts higher than node B. When this is the case, the output voltage of U1A is negative and the output voltage of comparator U2X is positive thereby turning on NPN transistor Q2. When NPN transistor Q2 turns on, the collector of NPN transistor Q2, which is connected to the base of NPN transistor Q1, is pulled to ground thereby turning off NPN transistor Q1. When NPN transistor Q1 turns off, the lead K12 is open circuited thereby shutting off motor M. On the other hand, when motor rotation is detected, the voltage on node A drops in value and is held down by the negative voltage output from U1B representing the input pulses resulting from making and breaking of electrical contact due to the rotation of the motor. When node A is held down beneath the value of node B, the output signal from operational amplifier U1A is positive. This positive output voltage is amplified by comparator U2X as a negative voltage, thereby turning off NPN transistor Q2 and thus allowing the base of NPN transistor Q1 to be pulled up through resistor R16 to the voltage E1 less 1 forward diode voltage drop. As a result, NPN transistor Q1 turns on thereby enabling relay K1 or relay K2 to conduct and the motor M to rotate.

In one embodiment, a jog pulse circuit is provided as shown in FIGS. 5 and 6. Specifically, the jog pulse circuit jogs the motor M to raise slightly the body of the gurney (i.e. upper frame member 12 (FIG. 1a) and any patient lying on the gurney) relative to the gurney's then current height. More specifically, this raising of the upper frame member 12 (FIG. 1a) of the gurney results in detent pin 701 (FIG. 7a) traveling, in one embodiment, approximately one quarter of an inch in the direction shown by the arrow "raise" in FIG. 7a thereby freeing the detent bar 760 to move away from pin 701. As shown in FIG. 7a, freeing detent pin 701 from groove 762A in detent bar 760 thereby allows sliding arm 26 to move either right or left depending upon whether it is desired to raise or lower the gurney.

The operation of the jog pulse circuit is described in more detail below. Referring to FIGS. 5 and 6, prior to the operator pulling the handle 711 (which causes switch S2 to change state as shown and discussed in detail below), the jog pulse switch S2 connects the voltage supplied by the battery E (FIG. 5) to the positive plate of capacitor C4, to the node between R10 and R11 and to the negative input of comparator U2Y (FIG. 6). In this state, capacitor C4 charges to the voltage level of the battery E, and no power is provided to S1 and the motor M (FIG. 5). When the operator pulls handle 711, switch S2 disconnects from the positive plate of C4 and connects to the common terminal of S1. In this state, power is supplied through switches S1, S6 and S7 to the relay K1 and to the DMM (FIG. 6) through diode D2. Accordingly, the voltage on C4 begins to decrease at a predetermined rate (which is determined by the time constant R11*C4). While the voltage on C4 is greater than the voltage on the positive input terminal of comparator U2Y (which is determined by the voltage on the junction of R12 and Rx), the DMM is enabled and NPN transistor Q1 conducts thereby connecting the terminal K12 to ground (GND) which completes the circuit between the battery E and the relay K1 thereby allowing the motor M to be turned on. The motor drives the lead screw 144 (FIG. 7b) causing the sliding arm 26 to move in the RAISE direction as shown in FIG. 7a. The detent pin 701 (FIG. 7a) is thereby sufficiently moved to be free from the detent bar 760 allowing the detent bar 760 to move in the direction shown by arrow 761 in FIG. 7a if the operator fully pulls the handle 711.

However, if the operator does not fully pull the handle 711 (i.e., fully pulling the handle 711 causes switch S1 to change state as discussed in detail below), the voltage on C4 continues to decrease. As a result, in approximately 0.15 seconds (the actual time will vary depending on the charge level of the battery and on component tolerances) the voltage on C4 decreases below the voltage on the positive input terminal of comparator U2Y. As a result, the output signal from comparator U2Y goes high thereby turning on NPN transistor Q3 to ground the base of NPN transistor Q1 and thus shut off NPN transistor Q1. Shutting off NPN transistor Q1 opens the circuit between the battery E (FIG. 5) and the relay K1. Thus, the motor M (FIG. 5) is turned off, and the sliding arm 26 reverses direction and returns to its original position (i.e., the notch sliding arm 26 occupied before the handle 711 was pulled by the operator) secured in the detent bar 760. Accordingly, the jog pulse circuit provides a pulse of energy sufficient only to jog the motor to free the pin 701 from the detent bar 760.

Accordingly, the jog pulse circuit requires the operator to fully pull the handle 711 in order to raise or lower the gurney under power. Referring to FIGS. 5 and 6, if the operator fully pulls the handle 711 (FIG. 7b), switch S1 changes state. As a result, switch S1 disconnects from S6 thereby deenergizing the relay K1 and temporarily disabling the DMM (FIG. 5) resulting in the motor M (FIG. 5) being turned off. When switch S1 connects to lead E1, the battery E begins to charge the capacitor C4 through diode Dx and resistor R10 thereby increasing the voltage on C4 above the voltage on the positive input terminal of comparator U2Y. As a result, the output signal from comparator U2Y goes low shutting off NPN transistor Q3 and allowing NPN transistor Q1 to be turned on by the high level voltage from the battery E on lead E1 passed through diode D1 and resistor R16 to the base of NPN transistor Q1. The turning on of NPN transistor Q1 closes the circuit between terminal K12 and GND thereby enabling DMM. Further, switch S3A COM is energized by the battery E through the diode D8 and depending on the operator selection of the position of switch S3A, (i.e., if switch S3A is in the UP position) the motor may be turned on to raise the gurney by energizing K1 through S4, or (i.e., if switch S3A is in the DOWN position) the motor may be turned on to lower the gurney by energizing K2 through S5, or (i.e., if switch S3A is in the COAST position) the gurney will coast down under the weight of the patient lying on the gurney. If the operator selected the COAST position of switch S3A, the operator is simply using the power assist system to free the detent pin 701 allowing the detent bar 760 to move in the direction 761 as shown in FIG. 7a and the sliding arm 26 to move in the LOWER direction as shown in FIG. 7a which results in lowering the gurney. Thus, the jog pulse circuit advantageously prevents operators from jamming the gurney, because the jog pulse circuit requires operators to fully pull the handle in order to raise or lower the gurney.

In one embodiment, a low battery detection circuit is also provided as shown in FIGS. 5 and 6. In this embodiment, the low battery detection circuit includes comparator U2Y and NPN transistor Q3. In particular, a reference voltage is provided to the positive input terminal of comparator U2Y. The reference voltage is established by voltage divider R12 and Rx connected to zener diode Zx. Zener diode Zx, powered by battery E (FIG. 5) through diode D1 and resistor R20, provides a relatively constant voltage reference for the low battery detection circuit as well as other portions of the DMM circuit. A voltage proportional to actual battery voltage level, established by the voltage divider R10 and R11 which is powered by the battery E (FIG. 5) through diode Dx, is provided to the negative input terminal of comparator U2Y. The output signal of comparator U2Y drives NPN transistor Q3, and the output signal of NPN transistor Q3 drives the base input terminal of NPN transistor Q1. NPN transistor Q1 enables or disables the motor control relays K1 and K2 (FIG. 5). NPN transistor Q1 also enables or disables the audio alarm BZR connected to the terminal K12. In one embodiment, R10 is 47K ohms, R is 100K ohms, R12 is 47K ohms, RX is 47K ohms, and zener diode ZX is a 5.2 volt zener diode.

The operation of the low battery detection circuit is described in more detail below. When the handle 711 (FIG. 7b) is fully pulled, the DETENT switch S1 (also indicated by reference numeral 73 in FIG. 7b) is activated and connects the battery E (FIG. 5) to terminal E1. Accordingly, the reference voltage is established on the positive input terminal of comparator U2Y, and a voltage proportional to the actual battery voltage is established on the negative input terminal of comparator U2Y. If the battery voltage decreases such that the voltage on the negative input terminal of comparator U2Y decreases below the reference voltage on the positive input terminal of comparator U2Y, then the comparator U2Y provides a positive output signal causing NPN transistor Q3 to conduct thereby turning off NPN transistor Q1. When NPN transistor Q1 turns off, motor control relay K1 or K2 (one of which is energized) is deenergized, and the BZR is energized thereby activating the audio alarm BZR. The low battery detection circuit also provides a physical indication of a low battery, namely, a pulsating response as the motor control relay K1 or K2 (whichever is energized) is deenergized, to operators when battery voltage is low (i.e., decreases below a predetermined level).

Further, the audio alarm BZR will be activated when the motor M (FIG. 5) is stalled. A stalled motor is anything from 0 to whatever number is required to place the voltage on node A at a sufficiently different value above the voltage on node B to cause transistor Q1 to shut off.

FIG. 7b illustrates the location of detent bars 760A and 760B in relation to sliding arm 26, motor 40 and lead screw 144. In some gurneys, two detent bars 760A and 760B are used for added safety, one on each side of lead screw 144. However, the operation of the detent bars 760A and 760B is identical to that described above in conjunction with detent bar 760 shown in FIG. 7a.

Accordingly, one embodiment of the present invention provides an electronic control system and an electric motor that allow one paramedic or operator to load a gurney with a patient on it into an ambulance or onto a different elevation. Referring to FIG. 1a, the front wheels 30a beneath the top frame at the head end 30 of the gurney are placed on the surface on which the gurney is is to be landed. The operator then sets the profile switch 72 to low profile to raise the under carriage 16 to place the gurney at a low profile with the under carriage close to the upper frame member 12 of the gurney. The operator then just pushes the gurney onto the new surface on which the gurney is to rest. This surface could be the floor of an ambulance or a loading dock or some other platform. To remove the gurney, the operator pulls the gurney out leaving the front wheels 30*a* beneath the upper frame member 12 at the head end 30 of the gurney resting on the surface from which the gurney is being removed and switch 72 to high profile operation, thereby lowering the bottom wheels 28 on lower frame member 16 to the ground. The gurney then can be rolled on the ground or the new surface without any discomfort by one operator.

In particular, various embodiments of the electronic control system of the present invention can advantageously be included in a power lifting unit. For example, in one embodiment the present invention advantageously provides a jog pulse circuit that prevents operators from jamming the gurney. In another embodiment, the present invention advantageously provides a jog-off high limit circuit that prevents operators from attempting to raise the gurney beyond its maximum height. In yet another embodiment, the present invention advantageously provides a low battery detection circuit that provides both an audible and physical indication (i.e., a pulsating response) for notifying operators that battery voltage is low.

Figure 4A:
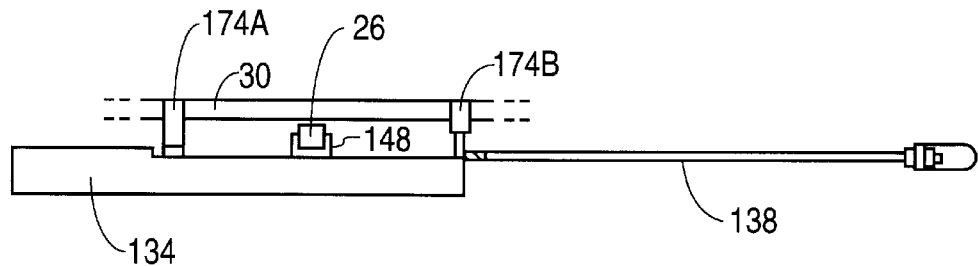
FIG. 4a illustrates the side view of a unitary structure for holding the electric motor, and the threaded assembly engaged with the lead screw, and the lead screw connected to the tension arm for raising and lowering the mobile patent transporter.
Figure 4B:
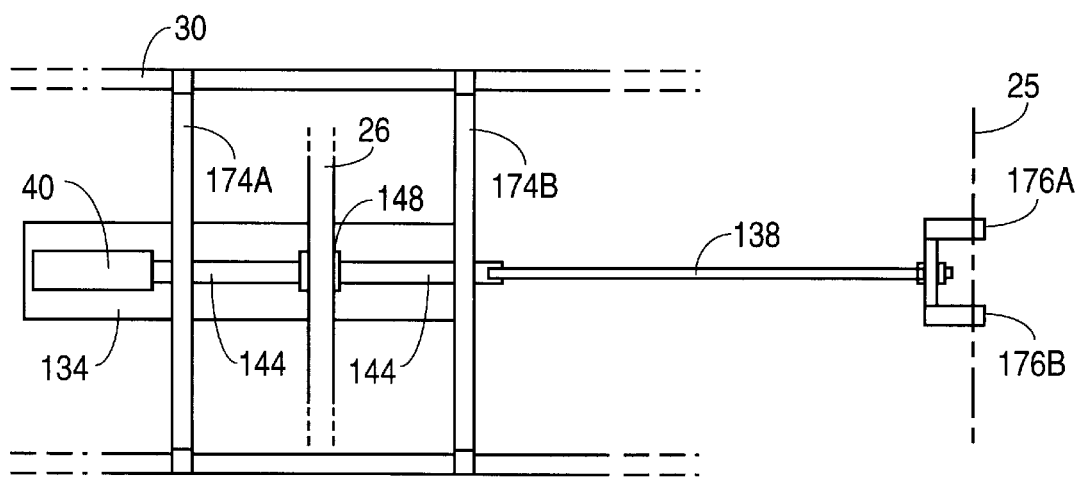

The above description is intended to be illustrative and not restrictive. Many variations of the invention will become apparent to those skilled in the art upon review of this disclosure. Merely by way of example but without limitation, the power lifting unit of the present invention has been illustrated in relation to a mobile patient transporter, but it will be apparent to those skilled in the art that the invention may readily be applied to hand trucks, dollies, desks, tables, benches, ladders, stools, construction scaffolding, and the like. Further, bearings and other friction reducing devices may be used at various load points to improve efficiency and reduce the power required to operate the lifting unit. Furthermore, the detent structure presently existing on gurneys can be eliminated and replaced with a detent mechanism integral with the power unit 134 (FIG. 4*a*). Still further, protective housings, sleeves, or shields may be used for increased safety and ease of maintenance. The scope of this invention should, therefore, be determined with reference to the appended claims along with their full scope of equivalents.

What is claimed is:

1. A power lifting apparatus for adjusting the height of a gurney, the gurney having a platform with a top surface for holding a person and a bottom surface, an undercarriage containing wheels, and a scissors-like structure connecting said platform to said undercarriage, said apparatus comprising:

an electric motor attached to the gurney and capable of raising or lowering the gurney;

a battery connected to said electric motor; and an electric circuit for controlling said electric motor, said electric circuit including a jog pulse circuit.

2. Apparatus in claim 1 wherein said jog pulse circuit comprises a jog switch connected to a capacitor, said capacitor being connected to a negative input lead of a comparator, a reference voltage connected to a positive input lead of said comparator, an output signal of said comparator causing a switch to close so as to activate said electric motor by connecting said electric motor to said battery so long as the voltage on the negative input lead of said comparator is greater than said reference voltage.

3. Apparatus in claim 2 wherein said switch comprises an NPN transistor.

4. Apparatus in claim 2 wherein said voltage of said capacitor decreases below said reference voltage in approximately 0.15 seconds.

5. Apparatus as in claim 1 further comprising:

a detent means capable of holding the gurney at a selected height.

6. Apparatus in claim 5 wherein said jog pulse circuit provides a pulse of energy sufficient for releasing said detent means.

7. Apparatus as in claim 6 further comprising:

a detent switch, said detent switch capable of connecting said electric motor to said battery; and a detent handle for engaging or disengaging said detent switch.

8. Apparatus in claim 7 wherein said jog pulse circuit turns off said electric motor if said detent handle is not properly engaged within a predetermined period of time of releasing said detent means.

9. Apparatus as in claim 1 further comprising:

a low battery detection circuit capable of detecting when said battery has a voltage below a predetermined level.

10. Apparatus in claim 9 wherein said low battery detection circuit comprises a comparator, a voltage dependent on said voltage of said battery connected to a negative input lead of said comparator, a reference voltage connected to a positive input lead of said comparator, an output signal of said comparator closing a switch so as to activate an audio alarm and to disconnect said electric motor from said battery, whereby said low battery detection circuit provides both an audio alarm and a physical indication of a pulsating response when said voltage of said battery decreases below said predetermined level.

11. Apparatus as in claim 1 further comprising:

a jog-off high limit means for preventing said electric motor from being turned on to attempt to raise the gurney when the gurney has already been raised to its maximum height.

12. A power lifting apparatus for adjusting the height of a gurney, said power lifting apparatus including:

an electric motor for driving structure which raises or lowers the gurney;

a rechargeable battery connected to said electric motor; and a control circuit including an electrical switch having a first position to raise the height of the gurney, a second position to lower the height of the gurney and a third position to allow the gurney to coast to its rest position, the speed at which the gurney coasts to its rest position being controlled by the inertia of, and the friction associated with, said electric motor and the structure driven by said electric motor, said control circuit further including a jog pulse circuit.

13. Apparatus in claim 12 wherein said jog pulse circuit comprises a jog switch connected to a capacitor, said capacitor being connected to a negative input lead of a comparator, a source of a reference voltage being connected to a positive input lead of said comparator, an output signal of said comparator causing a switch to close so as to disconnect said electric motor from said rechargeable battery, whereby said jog switch causes said electric motor to connect to said rechargeable battery so long as the voltage on said capacitor is greater than said reference voltage.

14. Apparatus in claim 13 wherein said jog pulse circuit provides a pulse of energy sufficient for jogging the gurney to disengage any detent means holding the gurney at a selected height, said jog pulse circuit capable of turning off said electric motor within a predetermined period of time of activation of said jog switch.

15. Apparatus as in claim 12 further comprising:

a low battery detection circuit capable of detecting when said rechargeable battery has a voltage below a predetermined level, said low battery detection circuit comprising a comparator, a voltage dependent on said voltage of said rechargeable battery being applied to a negative input lead of said comparator, a reference voltage being applied to a positive input lead of said comparator, an output signal of said comparator closing a switch so as to activate an audio alarm and to disconnect said electric motor from said rechargeable battery, whereby said low battery detection circuit provides both an audio alarm and a physical indication of a pulsating response when said voltage of said rechargeable battery decreases below said predetermined level.

16. Apparatus as in claim 15 wherein said switch is an NPN transistor.

17. Apparatus as in claim 12 further comprising:

a jog-off high limit means for preventing said electric motor from being turned on to attempt to raise the gurney when the gurney has already been raised to its maximum height.

18. A power lifting apparatus for adjusting the height of a gurney, said power lifting apparatus including:

an electric motor for driving structure which raises or lowers the gurney;

a rechargeable battery connected to said electric motor;

a control circuit including an electrical switch having a first position to raise the height of the gurney, and a second position to lower the height of the gurney; and a jog pulse means for jogging the gurney to disengage any detent means holding the gurney at a selected height.

19. Apparatus as in claim 18 further comprising:

a low battery detection means for providing both an audio alarm and a physical indication of a pulsating response when voltage of said rechargeable battery decreases below a predetermined level.

20. Apparatus as in claim 19 further comprising:

a jog-off high limit means for preventing said electric motor from being turned on to attempt to raise the gurney when said gurney has already been raised to its maximum height.

* * * * *